United States Patent [19]

Iwasaki

[11] Patent Number: 5,148,244
[45] Date of Patent: Sep. 15, 1992

[54] ENHANCEMENT-FET AND DEPLETION-FET WITH DIFFERENT GATE LENGTH FORMED IN COMPOUND SEMICONDUCTOR SUBSTRATE

[75] Inventor: Hiroshi Iwasaki, Yokohama, Japan
[73] Assignee: Kabushiki Kaisha Toshiba, Kawasaki, Japan
[21] Appl. No.: 653,294
[22] Filed: Feb. 11, 1991

[30] Foreign Application Priority Data

Feb. 14, 1990 [JP] Japan .............................. 2-32698

[51] Int. Cl.⁵ .............................................. H01L 29/80
[52] U.S. Cl. ...................................... 357/22; 357/23.12
[58] Field of Search .................. 357/22, 22 R, 22 C, 357/22 I, 23.12

[56] References Cited

U.S. PATENT DOCUMENTS

| | | | |
|---|---|---|---|
| 4,701,646 | 10/1987 | Richardson | 357/22 I |
| 4,814,835 | 3/1989 | Tung | 357/22 I |
| 4,963,948 | 10/1990 | Awano | 357/22 |
| 5,021,857 | 6/1991 | Suehiro | 357/22 |

FOREIGN PATENT DOCUMENTS

| | | | |
|---|---|---|---|
| 60-134481 | 7/1985 | Japan | 357/22 |
| 60-176277 | 9/1985 | Japan | 357/22 |
| 60-183764 | 9/1985 | Japan | 357/22 |
| 62-206887 | 9/1987 | Japan | 357/23.12 |
| 63-46779 | 2/1988 | Japan | 357/22 |
| 1-11363 | 1/1989 | Japan | 357/22 |
| 1-227478 | 9/1989 | Japan | 357/22 |

*Primary Examiner*—Rolf Hille
*Assistant Examiner*—Steven Loke
*Attorney, Agent, or Firm*—Finnegan, Henderson, Farabow, Garrett and Dunner

[57] ABSTRACT

This invention provides an E/D integrated circuit obtained by connecting an enhancement transistor serving as a switching transistor to a depletion transistor serving as a load and having a gate length larger than a gate length of the enhancement transistor in series with each other.

11 Claims, 6 Drawing Sheets

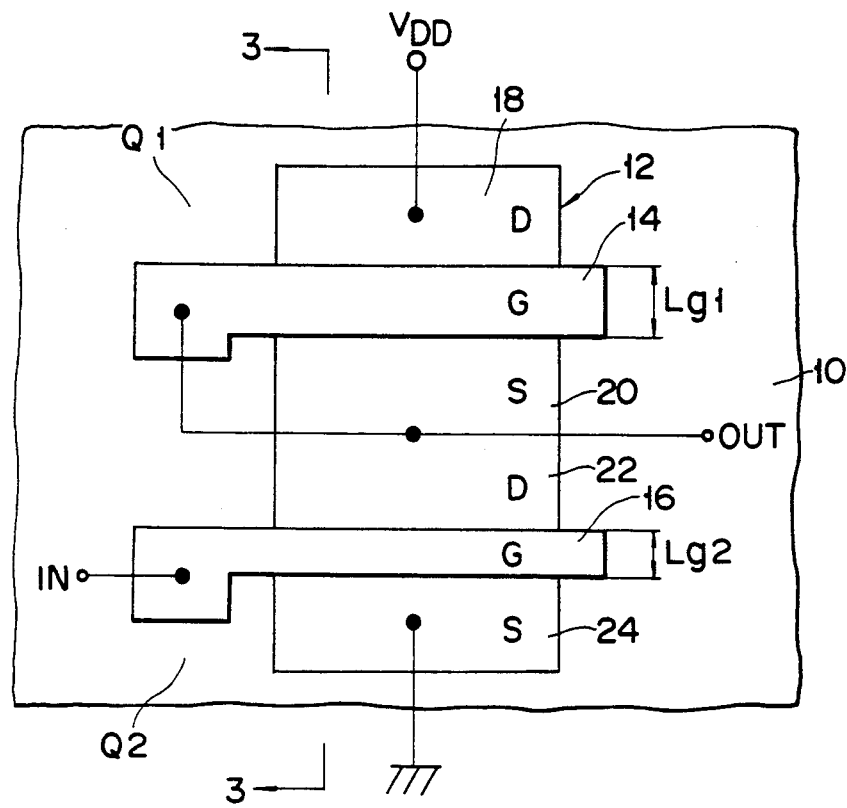
F I G. 2
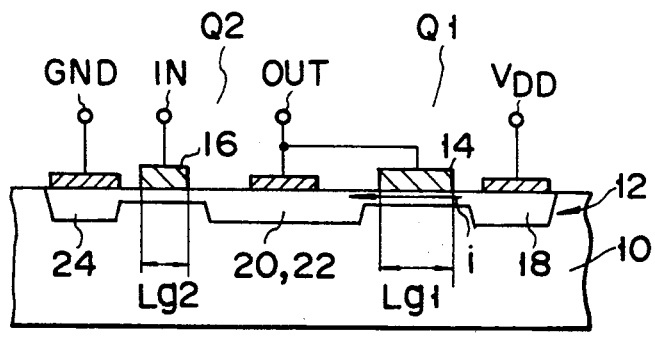
F I G. 3
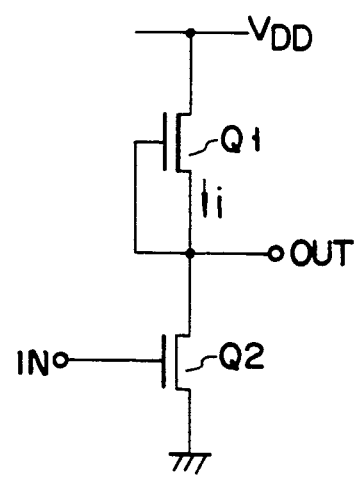
F I G. 4

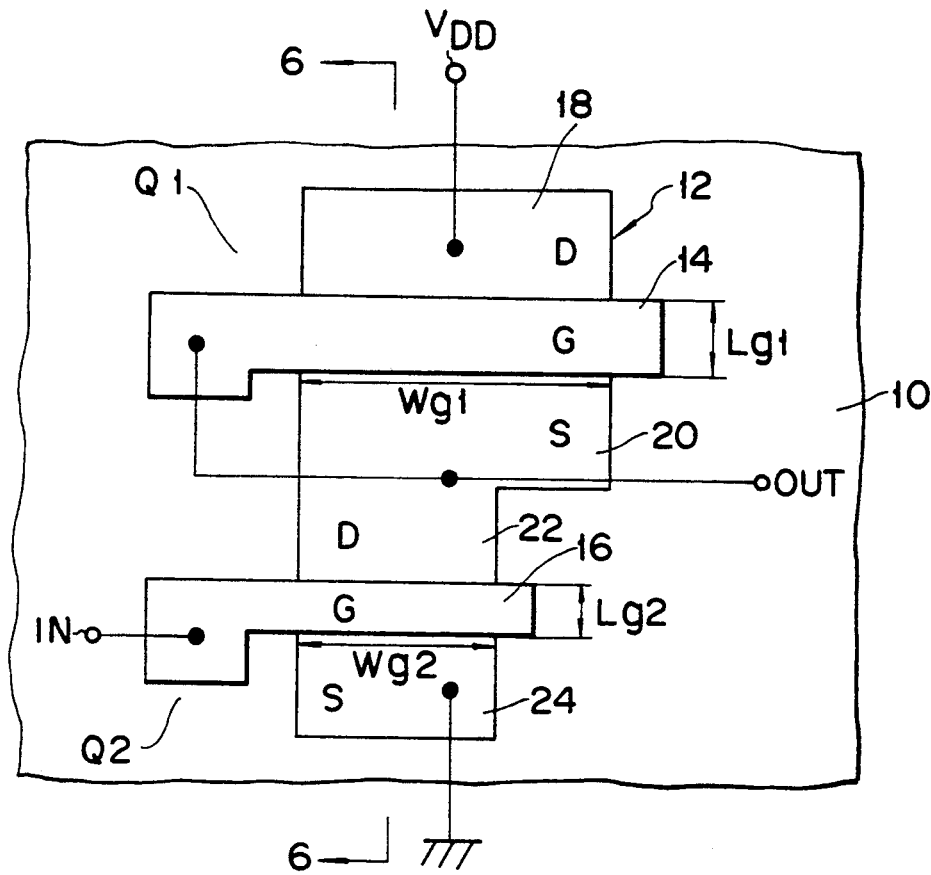
F I G. 5
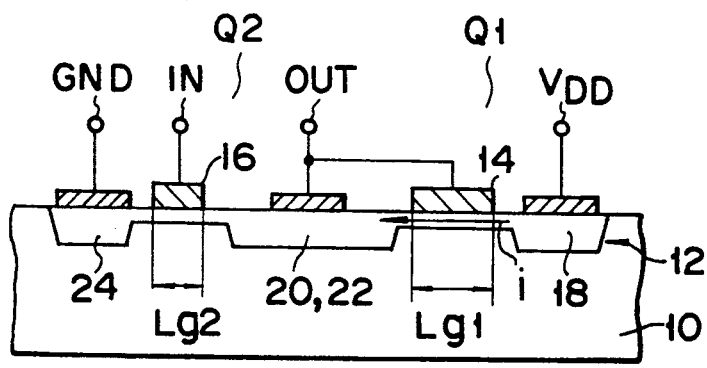
F I G. 6

ENHANCEMENT-FET AND DEPLETION-FET WITH DIFFERENT GATE LENGTH FORMED IN COMPOUND SEMICONDUCTOR SUBSTRATE

BACKGROUND OF THE INVENTION

1. Field of the Invention

The present invention relates to an E/D integrated circuit obtained by connecting a depletion field effect transistor serving as a load and an enhancement field effect transistor serving as a switching transistor in series with each other and, more particularly, to an improvement of the performance of the E/D integrated circuit when it is formed in a compound semiconductor substrate.

2. Description of the Related Art

As an E/D circuit obtained by connecting a depletion field effect transistor (to be referred to as a D-type FET or a D-type MESFET hereinafter) serving as a load and an enhancement field effect transistor (to be referred to as an E-type FET or an E-type MESFET hereinafter) serving as a switching transistor in series with each other, an E/D inverter is widely known.

In a conventional method, in order to add a parasitic capacitance to an E/D inverter or the like, a gate length and a gate width generally have minimum dimensions. This is a condition which is necessarily required for an E-type FET serving as a switching transistor requiring a high-speed operation. In a D-type FET serving as a load, this condition is satisfied. Therefore, the gate lengths of the D-type FET serving as a load and the E-type FET serving as a switching transistor are equal to each other.

However, in minimum dimensions, i.e., in a range of a gate length obtained by the most advanced process, a threshold voltage of an FET largely varies. This case is shown in FIG. 1. FIG. 1 is a view schematically showing a relationship between the gate length and threshold voltage of a transistor. As shown in FIG. 1, in a range r of a gate length obtained by the most advanced process, a threshold value largely varies due to small process fluctuations. Especially in an E/D inverter, when the threshold voltage of a D-type FET serving as a load varies, a current supplied to an E-type FET serving as a switching transistor connected in series with the D-type FET varies. When a current supplied to the E-type FET varies, a variation in output voltage or the like is caused, and the performance serving as the switching circuit is degraded. Since a process technique is not sufficiently established especially in a GaAs IC/LSI, a variation in threshold value of the GaAs IC/LSI due to process fluctuations is larger than that of a silicon IC/LSI. For this reason, in the GaAs IC/LSI, a circuit design capable of absorbing the process fluctuation is desired.

SUMMARY OF THE INVENTION

The present invention has been made in consideration of the above problem, and has as its object to provide an E/D integrated circuit for obtaining a circuit design capable of absorbing process fluctuations and of obtaining excellent performance even when the E/D integrated circuit is formed in a compound semiconductor substrate.

The above object can be achieved by the following arrangement.

According to the present invention, an integrated circuit is obtained by connecting an E-type FET serving as a switching transistor and a D-type transistor serving as a load and having a gate length larger than that of the E-type FET in series with each other.

In the above integrated circuit, the gate length of the D-type FET serving as a load is set to be larger than the gate length of the E-type FET serving as a switching transistor. For example, the gate length of the E-type FET is formed to have a minimum dimension obtained by the most advanced process, the gate length of the D-type FET is larger than the gate length having the minimum dimension of the E-type FET. Therefore, even when process fluctuations occur, the gate length is formed to have a dimension falling within a range wherein a threshold value is stable. Therefore, a variation in threshold voltage of the D type FET serving as a load is prevented, a stable current can be constantly supplied to the E-type FET serving as a switching transistor, and an output from the circuit is stabilized.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view showing a pattern of an integrated circuit according to the first embodiment of the present invention;

FIG. 3 is a sectional view showing the integrated circuit along a line 3—3 in FIG. 2;

FIG. 4 is an equivalent circuit diagram showing the integrated circuit shown in FIGS. 2 and 3;

FIG. 5 is a plan view showing a pattern of an integrated circuit according to the second embodiment of the present invention;

FIG. 6 is a sectional view showing the integrated circuit along a line 6—6 in FIG. 5;

DETAILED DESCRIPTION OF THE PREFERRED EMBODIMENTS

Figure 1:
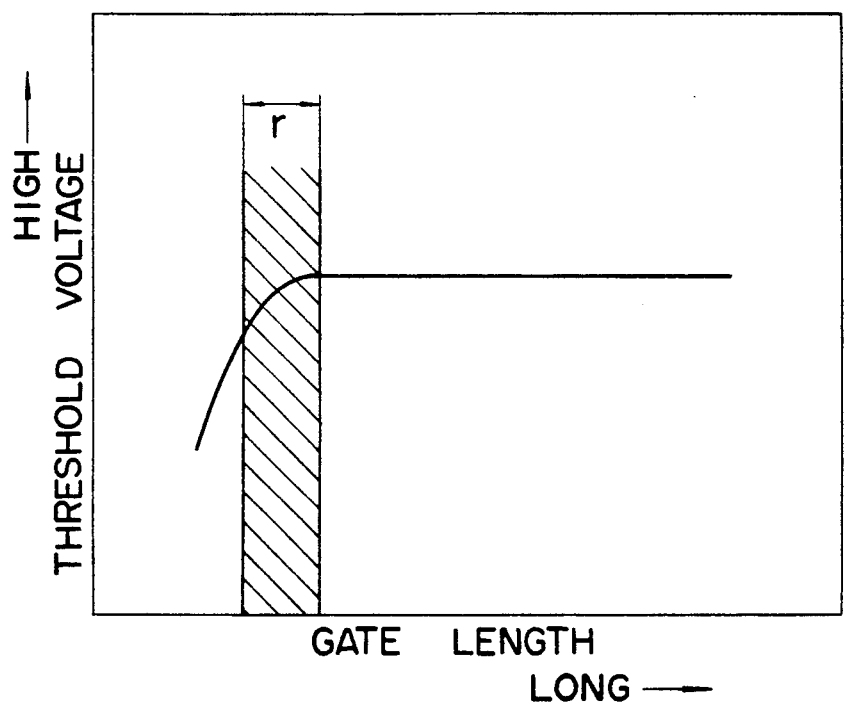
FIG. 1 is a graph showing a relationship between a gate length and a threshold value.

Embodiments of the present invention will be described below with reference to the accompanying drawings.

First Embodiment

FIG. 2 is a plan view showing a pattern of an integrated circuit according to the first embodiment of the present invention. This view illustrates an E/D inverter of a DCFL (Direct Coupled FET Logic) circuit as an example. FIG. 3 is a sectional view showing the E/D inverter along a line 3—3 in FIG. 2, and FIG. 4 is an equivalent circuit diagram of the E/D inverter.

As shown in FIGS. 2 to 4, an active region 12 for constituting a source/drain or a channel is formed in a surface region of a GaAs substrate 10. A gate electrode 14 of a D-type MESFET Q1 and a gate electrode 16 of an E-type MESFET Q2 are formed in the active region 12.

Each gate electrode 14 or 16 has a length, which is conventionally defined as the dimension in a direction parallel to the current path, and a width, which is conventionally defined as the dimension in a direction perpendicular to the current path. A new drain 18 of the D-type MESFET Q1 is connected to a high-potential power source VDD. A source 20 of the D-type MESFET Q1 is integrated with a drain 22 of the E-type MESFET Q2. A source 24 of the E-type MESFET Q2 is connected to a low-potential power source, e.g, ground. An input terminal IN is connected to the gate electrode 16 of the E-type MESFET Q2 serving as a switching transistor. An output terminal OUT is connected to the source region 20 of the D-type MESFET Q1 and to the drain region 22 of the E-type MESFET Q2 and connected to the gate electrode 14 of the D-type MESFET Q1.

The DCFL circuit with the above arrangement is operated as an inverter, as is apparent from an equivalent circuit diagram in FIG. 4.

According to the present invention, a gate length Lg1 of the D-type MESFET Q1 serving as a load is set to be larger than a gate length Lg2 of the E-type MESFET Q2 serving as a switching transistor. In the above DCFL circuit, in order to maximize high-speed performance, the gates of the D-type MESFET Q1 and of the E-type MESFET Q2 are formed by the most advanced process. The formation using the most advanced process means that the gate length of the gate electrode is set to be a minimum dimension obtained by a state-of-the art technique. In this case, an influence of the threshold voltage of the MESFET for the gate length is schematically shown in FIG. 1. In FIG. 1, the gate length obtained by the most advanced process is plotted in a hatched portion where the threshold voltage begins to fall from a constant value, i.e., a region r in FIG. 1.

In an individual unit process or a silicon device made of a stable substrate material, since the gate length obtained by the most advanced process can be controlled with good reproducibility and high accuracy, variations in threshold voltage of MESFETs are small. However, in a compound semiconductor device represented by a GaAs device, a unit process is technically inferior to that of a silicon device, and the substrate made of two types of materials is not stable compared with a substrate made of silicon or the like. Therefore, the gate length cannot be controlled by the most advanced process with good reproducibility and high accuracy. As a result, the MESFETs have large variations in threshold voltage. In the compound semiconductor device, since the unit process and the substrate are less stable than the silicon device, the gate length is difficult to be controlled by the most advanced process.

In the E/D inverter shown in the equivalent circuit diagram of FIG. 4, a maximum operating speed of an E-type MESFET Q2 serving as a switching transistor must be obtained. For this reason, the E type MESFET Q2 must have a gate length having a minimum dimension obtained by the most advanced process i.e.. a gate length falling within a range r in FIG. 1.

The D-type MESFET Q1 is used for supplying a current i to the E-type MESFET Q2. The present invention is made in consideration of stably supplying the current i to the E-type MESFET Q2, and a gate length larger than the gate length having a minimum dimension falling within the range r in FIG. 1 is employed to the D-type MESFET Q1 serving as a load. That is, the gate length falls outside the range r in FIG. 1, and the threshold voltage of the MESFET is to be stable even when process fluctuations occur. Therefore, the D-type MESFET Q1 can always supply the constant current i to the E-type MESFET Q2 serving as a switching transistor.

In a GaAs digital IC/LSI, in order to stably obtain the above effect, assuming that the gate length Lg2 of the E-type MESFET serving as a switching transistor has a minimum dimension obtained by the most advanced process, the gate length Lg1 of the D-type MESFET Q1 serving as a load desirably satisfies the following condition.

$$Lg1 \geq 1.5 \times Lg2 \qquad (1)$$

As shown in equation (1), when the gate length Lg1 of the D-type MESFET Q1 serving as a load is set to be 1.5 times or more the gate length Lg2 of the E-type MESFET Q2 serving as a switching transistor, the threshold voltage of the MESFET is sufficiently stable even when process fluctuations occur.

In an E/D inverter according to the first embodiment, the length Lg1 of the D-type MESFET Q1 serving as a load is set to be a length which allows the threshold voltage to be stable even when process fluctuations occur. Therefore, a stable current can be supplied to the D-type MESFET Q2 serving as a switching transistor, and a voltage output from the output terminal OUT can be stabilized. In addition, since the gate length Lg2 of the E-type MESFET Q2 is set to be a minimum gate length obtained by the most advanced process, a parasitic capacitance is decreased to enable increased switching speed.

Second Embodiment

In a MESFET having a large gate length, a drain current tends to be decreased. In the integrated circuit according to the first embodiment, the D-type MESFET Q1 has this tendency. In order to keep a current which can be supplied from the E-type MESFET Q2 having a gate length of a minimum dimension to be equal to a current which can be supplied from the D-type MESFET Q1 serving as a load at the same value, the gate width of the E-type MESFET Q2 is set to be smaller than the gate width of the D-type MESFET Q1.

FIG. 5 is a plan view showing a pattern of an inverter designed on the basis of the above idea, and FIG. 6 is a sectional view showing the inverter along a line 6—6 in FIG. 5. The same reference numerals as in FIGS. 2 and 3 denote the same parts in FIGS. 5 and 6.

As shown in FIG. 5, a gate width Wg2 of the E-type MESFET Q2 is set to be smaller than a gate width Wg1 of the D-type MESFET Q1. In this case, a current which can be supplied from the D-type MESFET Q1 can be equal to a current which can be supplied from the E-type MESFET Q2, and the performance of the E-type MESFET Q2 can be maximized.

To make a current which can be supplied from the D type MESFET Q1, equal to a current which can be supplied from the E-type MESFET Q2, as described above, it is desirable that the gate widths Wg1 and Wg2 satisfy the following condition.

A drain current $I_D$ of an FET is schematically expressed by:

$$I_D = \frac{W}{L} \cdot \mu \cdot C \left\{ (V_{GS} - V_{th})V_{DS} - \frac{1}{2} V_{DS}^2 \right\} \quad (2)$$

where $\mu$: carrier mobility, $V_{GS}$: gate-source voltage, C: capacitance, $V_{DS}$: drain-source voltage, $V_{th}$: threshold voltage of FET.

Therefore, a drain current $I_{D1}$ of the MESFET Q1 can be expressed by the following equation:

$$I_{D1} = \frac{Wg1}{Lg1} \cdot \mu \cdot C \left\{ (V_{GS} - V_{th})V_{DS} - \frac{1}{2} V_{DS}^2 \right\} \quad (3)$$

Similarly, as drain current $I_{D2}$ of the MESFET Q2 is expressed by the following equation:

$$I_{D2} = \frac{Wg2}{Lg2} \cdot \mu \cdot C \left\{ (V_{GS} - V_{th})V_{DS} - \frac{1}{2} V_{DS}^2 \right\} \quad (4)$$

Since the MESFET Q1 and the MESFET Q2 are formed and integrated in the same substrate, it can be assumed that terms of $\mu \cdot C\{(V_{GS}-V_{th})V_{DS}-(\frac{1}{2})V_{DS}^2\}$ of equations (3) and (4) have substantiality equal values. Therefore, the currents $I_{D1}$ and $I_{D2}$ can be expressed by the following equation:

$$\frac{Wg1}{Lg1} = \frac{Wg2}{Lg2} \quad (5)$$

According to equation (5), in order to make the currents $I_{D1}$ and $I_{D2}$ have the same value, the gate widths Wg1 and Wg2 satisfy the following equation:

$$Wg2 = \frac{Lg2}{Lg1} \cdot Wg1 \quad (6)$$

In designing the circuit, the gate widths Wg1 and Wg2 are set to the optimal values which are determined by other various design and structural factors. Therefore, the optimal values are not necessarily those values shown in FIG. 5, or need not satisfy equation (6).

Third Embodiment

Figure 7:
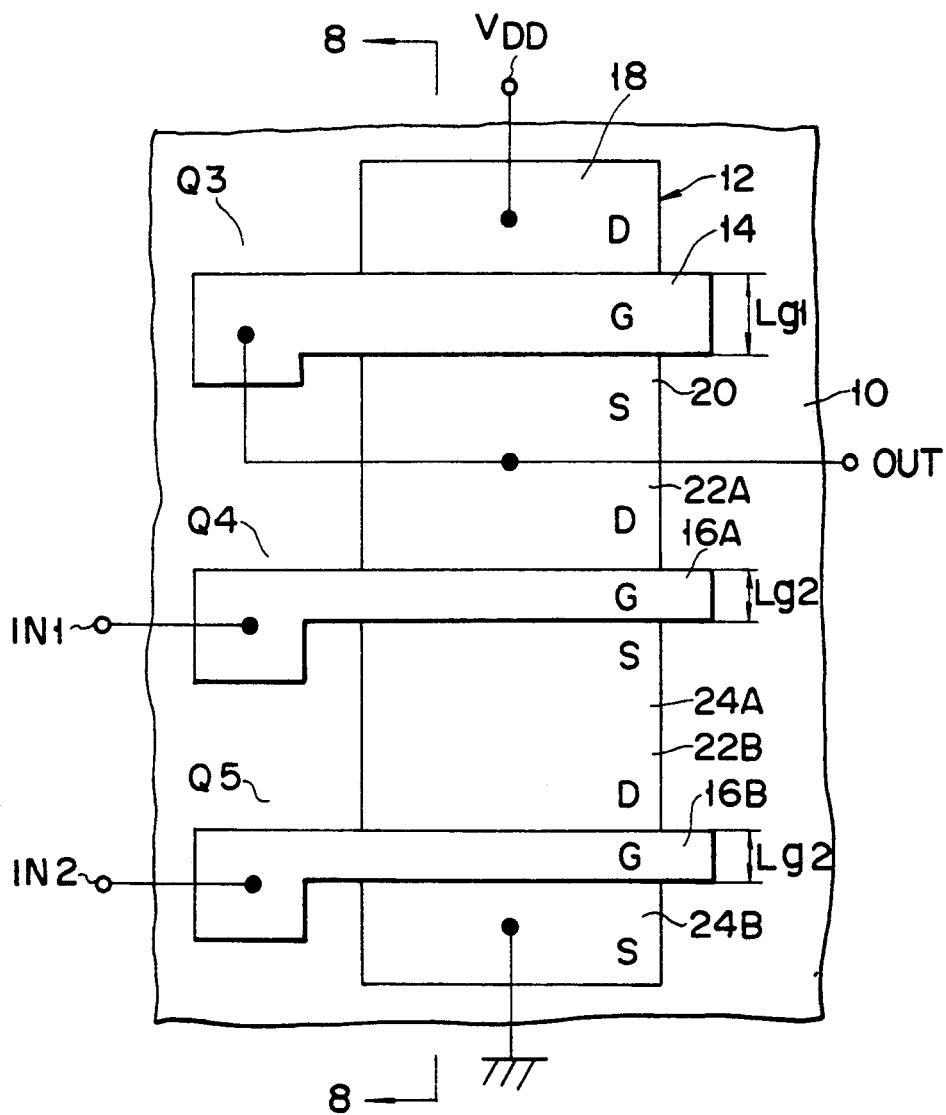
FIG. 7 is a plan view showing a pattern of an integrated circuit according to the third embodiment of the present invention.

According to the third embodiment, the present invention is applied to an E/D NAND circuit of a DCFL circuit. FIG. 7 is a plan view showing a pattern of the E/D NAND, FIG. 8 is a sectional view showing the E/D NAND circuit along a line 8—8 in FIG. 7, and FIG. 9 is an equivalent circuit diagram thereof.

Figure 8:
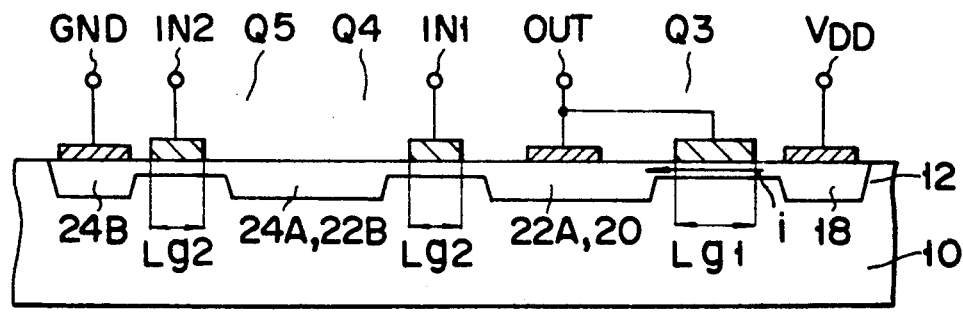
FIG. 8 is a sectional view showing the integrated circuit along a line 8—8 in FIG. 7.
Figure 9:
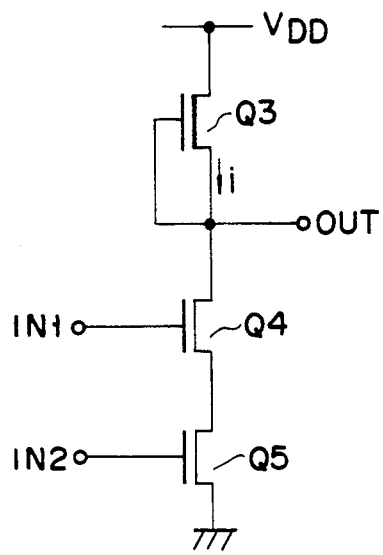
FIG. 9 is an equivalent circuit diagram showing the integrated circuit shown in FIGS. 7 and 8.

As shown in FIGS. 7 to 9, a drain 18 of a D-type MESFET Q3 serving as a load is connected to a high-potential power source VDD, and a source 20 of the D-type MESFET Q3 is connected to a gate electrode 14 and an output terminal OUT. E-type MESFETs Q4 and Q5 serving as switching transistors are connected between the source 20 of the D-type MESFET Q3 and a low-potential power source, e.g., ground, in series with each other. A drain 22A of the E-type MESFET Q4 is formed integrally with the source 20 of the D-type MESFET Q5, and the source 24A of the E-type MESFET Q4 is formed integrally with a drain 22B of the E-type MESFET Q5. A source 24B of the E-type MESFET Q5 is connected to, e.g., ground. Input terminals IN1 and IN2 are connected to the gates of the E-type MESFETs Q4 and Q5, respectively.

In the E/D NAND circuit with the above arrangement, as in the first embodiment, a gate length larger than a gate length obtained by the most advanced process is employed as the gate length Lg1 of the D-type MESFET serving as a load such that the threshold voltage is stable even when process fluctuations occur.

As the gate lengths Lg2 of the E-type MESFETs Q4 and Q5 serving as switching transistors, gate lengths obtained by the most advanced process are employed for increased switching speed.

As in the second embodiment, although not shown, the gate widths of the E-type MESFETs Q4 and Q5 may be smaller than the gate width of the D-type MESFET Q3, and currents which can be supplied from the E-type MESFETs Q4 and Q5 may be equal to a current which can be supplied from the D-type MESFET Q3.

Fourth Embodiment

Figure 10:
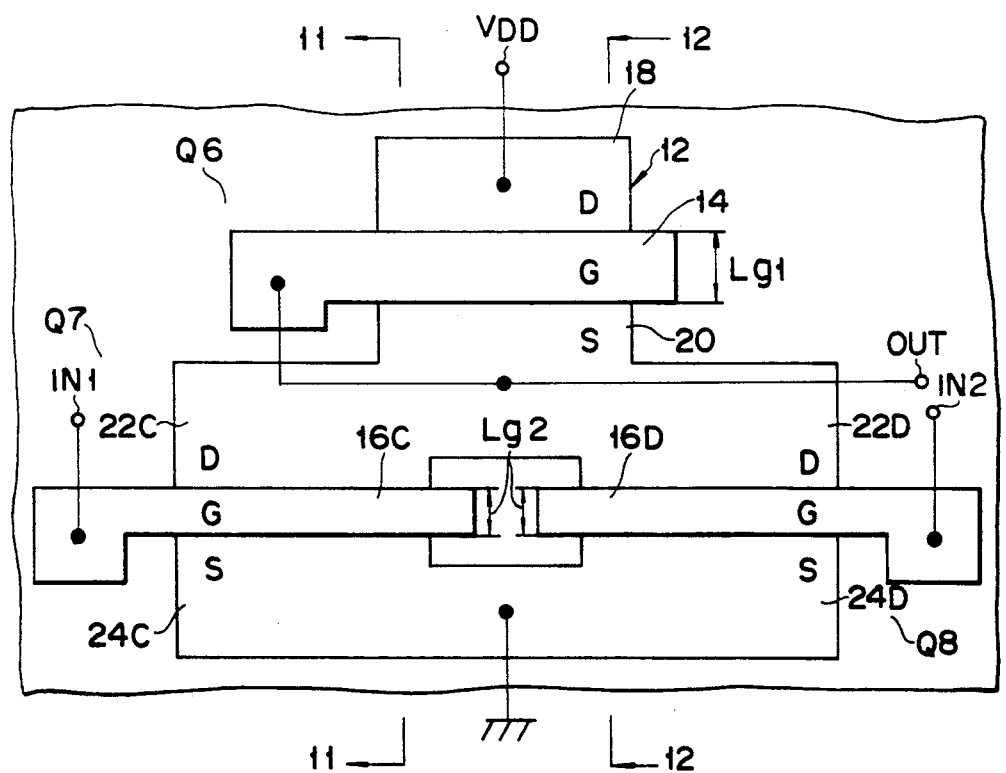
FIG. 10 is a plan view showing a pattern of an integrated circuit according to the fourth embodiment of the present invention.
Figure 11:
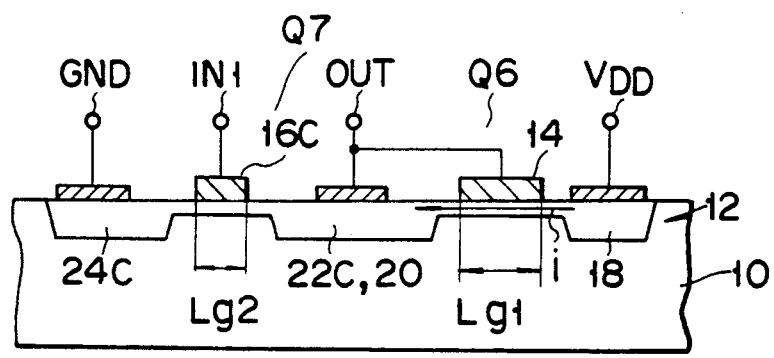
FIG. 11 is a sectional view showing the integrated circuit along a line 11—11 in FIG. 10.
Figure 12:
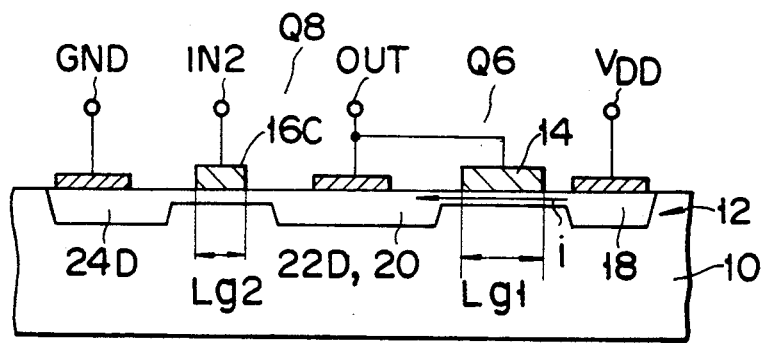
FIG. 12 is a sectional view showing the integrated circuit along a line 12—12 in FIG. 10.
Figure 13:
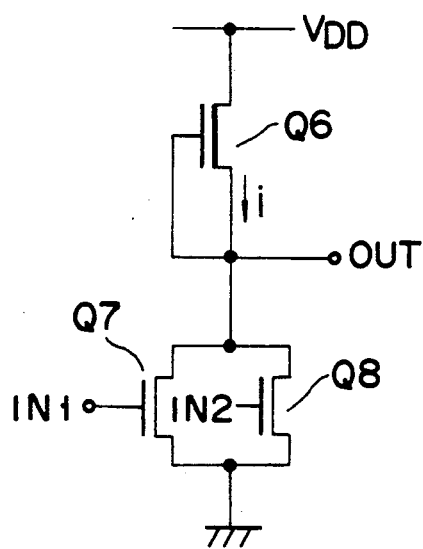
FIG. 13 is an equivalent circuit diagram showing the integrated circuit shown in FIGS. 10 to 12.

According to the fourth embodiment, the present invention is applied to an E/D NOR circuit of a DCFL circuit. FIG. 10 is a plan view showing a pattern of the E/D NOR circuit, FIG. 11 is a sectional view showing the E/D NOR circuit along a line 11—11 in FIG. 10, FIG. 12 is a sectional view showing the E/D NOR circuit along a line 12—12 in FIG. 10, and FIG. 13 is an equivalent circuit diagram thereof.

As shown in FIGS. 10 to 13, a drain 18 of a D-type MESFET Q6 serving as a load is connected to a high-potential power source VDD, and a source 20 of the D-type MESFET Q6 is connected to a gate electrode 14 and an output terminal OUT. E-type MESFETs Q7 and Q8 are connected in parallel between a source 20 of the D-type MESFET Q6 and a low-potential power source such as ground. Drains 22C and 22D of the E-type MESFETs Q7 and Q8 are formed integrally with the source 20 of the D-type MESFET Q6. Sources 24C and 24D of the E-type MESFETs Q7 and Q8 are formed integrally with each other and connected to ground. Input terminals IN1 and IN2 are connected to the gates of the E-type MESFETs Q7 and Q8, respectively.

In the E/D NOR circuit with the above arrangement, as in the first embodiment, the gate length Lg1 of the D-type MESFET Q6 serving as a load is a gate length which is stable even when process fluctuations occur.

Gate lengths Lg2 of the E-type MESFETs Q7 and Q8 serving as switching transistors are minimum gate lengths obtained by the most advanced process.

As in the second embodiment, the gate lengths of the E-type MESFETs Q7 and Q8 may be smaller than the gate width of the D-type MESFET Q6, and currents which are supplied from the D-type and E-type MESFETs may be equal to each other.

The DCFL circuits explained in the first to fourth embodiments have a high speed operation and can provide a stable output. Since the threshold voltage of the D-type MESFET serving as a load slightly varies even when process fluctuations occur in the production, variations and fluctuations in output value of the circuit are hard to occur.

An increase in parasitic capacitance due to increases in gate length and gate width of the D-type MESFET serving as a load rarely influences the switching speed of the circuit because the D-type MESFET connected to a gate and source supplies a current up to a current saturation region in advance.

The present invention is preferably applied to a compound semiconductor device (compound semiconductor digital IC/LSI) manufactured by a developing process technique. However, the present invention is not limited to the compound semiconductor device. When it can be applied to a semiconductor device such as a silicon device consisting of a one-element material, the same effect as described above can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit comprising:
   an enhancement transistor having a gate and a current path and serving as a switch, the gate of said enhancement transistor having a first gate length and a first gate width; and
   a depletion transistor having a gate and a current path and serving as a load, the gate of said depletion transistor having a second gate length and a second gate width;
   the current path of said enhancement transistor connected in series with the current path of said depletion transistor, the second gate length of said depletion transistor being greater than the first gate length of said enhancement transistor, and the second gate width of said depletion transistor being substantially equal to the first gate width of said enhancement transistor.

2. The semiconductor integrated circuit according to claim 1, wherein the second gate length of said depletion transistor is not less than 1.5 times the first gate length of said enhancement transistor.

3. The semiconductor integrated circuit according to claim 1, wherein said depletion transistor and said enhancement transistor are MESFETs.

4. The semiconductor integrated circuit according to claim 3, wherein said MESFETs are formed in a compound semiconductor substrate.

5. The semiconductor integrated circuit according to claim 4, wherein said compound semiconductor substrate is made of GaAs.

6. A semiconductor integrated circuit comprising:
   an enhancement transistor having a gate and a current path and serving as a switch, the gate of said enhancement transistor having a first gate length and a first gate width; and
   a depletion transistor having a gate and a current path and serving as a load, the gate of said depletion transistor having a second gate length and a second gate width;
   the current path of said enhancement transistor connected in series with the current path of said depletion transistor, the second gate length of said depletion transistor being greater than the first gate length of said enhancement transistor, and the second gate width of said depletion transistor being greater than the first gate width of said enhancement transistor.

7. The semiconductor integrated circuit according to claim 6, wherein the second gate length of said depletion transistor is not less than 1.5 times the first gate length of said enhancement transistor.

8. The semiconductor integrated circuit according to claim 6, wherein when the second gate length and the second gate width of said depletion transistor are represented by Lg1 and Wg1, and the first gate length and the first gate width of said enhancement transistor are represented by Lg2 and Wg2, the following equation is satisfied:

$$Wg2 = \frac{Lg2}{Lg1} \cdot Wg1$$

9. The semiconductor integrated circuit according to claim 6, wherein said depletion transistor and said enhancement transistor are MESFETs.

10. The semiconductor integrated circuit according to claim 11, wherein said MESFETs are formed in a compound semiconductor substrate.

11. The semiconductor integrated circuit according to claim 10, wherein said compound semiconductor substrate is made of GaAs.

* * * * *

UNITED STATES PATENT AND TRADEMARK OFFICE
CERTIFICATE OF CORRECTION

PATENT NO. :   5,148,244
DATED      :   September 15, 1992
INVENTOR(S):   Hiroshi Iwasaki It is certified that error appears in the above-identified patent and that said Letters Patent is hereby corrected as shown below:

Claim 10, column 8, line 43, change "claim 11"
to --claim 9--.

Signed and Sealed this

Nineteenth Day of April, 1994

Attest:

BRUCE LEHMAN

Attesting Officer        Commissioner of Patents and Trademarks